United States Patent
Butt et al.

(10) Patent No.: US 7,413,833 B2
(45) Date of Patent: Aug. 19, 2008

(54) SINGLE EXPOSURE OF MASK LEVELS HAVING A LINES AND SPACES ARRAY USING ALTERNATING PHASE-SHIFT MASK

(75) Inventors: Shahid Butt, Ossining, NY (US); Scott Bukofsky, Hopewell Junction, NY (US); Ramachandra Divakaruni, Ossining, NY (US); Carl Radens, Lagrangeville, NY (US); Wayne Ellis, Jericho, VT (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 700 days.

(21) Appl. No.: 10/846,275

(22) Filed: May 14, 2004

(65) Prior Publication Data

US 2005/0255387 A1    Nov. 17, 2005

(51) Int. Cl.
*G03F 1/00* (2006.01)
(52) U.S. Cl. .......................................................... 430/5
(58) Field of Classification Search .................. 430/5, 430/322–324; 361/212, 220
See application file for complete search history.

(56) References Cited

U.S. PATENT DOCUMENTS 6,841,309 B1 *   1/2005   Alpay et al. .................... 430/5
2004/0229129 A1 * 11/2004  Allen et al. .................... 430/5

* cited by examiner

*Primary Examiner*—Stephen Rosasco
(74) *Attorney, Agent, or Firm*—Slater & Matsil, L.L.P.

(57) ABSTRACT

An active area pattern is formed atop a deep trench pattern with a single exposure using an alternative phase-shift mask. To prevent adjacent spaces of opposite phase from intersecting one another at the ends of substantially opaque features of the active area pattern, one or more connectors are used to connect the ends of the substantially opaque patterns. Trench regions of the deep trench pattern are arranged such that the conduction path of the connectors are interrupted and prevent the lines from shorting to one another. Alternatively, a bit line pattern or a word line pattern having a lines and spaces array and a support region are printed with a single exposure using an alternating phase-shift mask. At one end of the array region, lines having a respective phase shift extend into the support region, and lines of the opposite phase shift are terminated. At the opposite end of the array, the lines that have the opposite phase shift extend into the support region, and the lines of having the respective phase shift are terminated.

51 Claims, 11 Drawing Sheets

SINGLE EXPOSURE OF MASK LEVELS HAVING A LINES AND SPACES ARRAY USING ALTERNATING PHASE-SHIFT MASK

BACKGROUND OF THE INVENTION

The present invention relates to photolithography methods and, more particularly, to optical lithography methods for forming fine-sized patterns on a wafer or other substrates, such as using a photolithographic mask and a projection lens.

In existing projection systems used in optical photolithography, a quasi-monochromatic, spatially incoherent light source of wavelength $\lambda$ is used to illuminate a photolithographic mask having various patterns, such as a periodic pattern of equally spaced lines. The illuminating beam is usually collimated to ensure a highly uniform intensity distribution at the plane of the mask, and an adjustable condenser stop is used to control the degree of coherence of the illuminating beam. The light is transmitted through the mask and collected by a projection lens which images the mask patterns onto a wafer located at the image projection plane, typically at a predetermined reduction ratio.

In such projection systems, a lines and spaces pattern on the mask diffracts the illuminating beam and forms a plurality of light beams that pass through a projection lens. An optical image of the lines and spaces pattern is formed on the wafer when the light beams interfere with each other. The smaller the pitch of the lines and spaces pattern on the mask, however, the larger the angle at which light diffracted by the mask spreads. Thus, if the pitch of the lines and spaces pattern is sufficiently small, the angle defined by two adjacent diffracted light beams is large enough for the first order and higher order diffracted light beams to impinge outside the projection lens so that no optical image is formed on the wafer.

To print such smaller lines and spaces patterns on a wafer, projection lenses having larger numerical apertures are used to accept larger incidence angles of diffracted light. The numerical aperture (NA) of a projection lens is defined as $NA = \sin \theta$, where $\theta$ is the half-angle of a cone that is subtended by the clear aperture of the projection lens at the wafer. As an alternative, the exposure wavelength is decreased to decrease the angle of diffraction occurring at the mask. In both methods, however, as the lines and spaces patterns that are to be printed approach submicron sizes, the contrast of the patterns formed on the wafer deteriorates, and the depth of focus decreases. As a result, neither alternative is practical at these smaller dimensions.

As an example, dynamic random access memory devices (DRAMs) typically include a semiconductor memory cell array formed of a plurality of memory cells arranged in rows and columns and include a plurality of bit lines as well as a plurality of word lines that intersect the bit lines. Each memory cell of the array is located at the intersection of a respective word line and a respective bit line and includes a capacitor for storing data and a transistor for switching, such as a planar or vertical MOS transistor. The word line is connected to the gate of the switching transistor, and the bit line is connected to the source or drain of the switching transistor. When the transistor of the memory cell is switched on by a signal on the word line, a data signal is transferred from the capacitor of the memory cell to the bit line connected to the memory cell or from the bit line connected to the memory cell to the capacitor of the memory cell.

Current DRAM technology often uses a buried capacitor DRAM memory in which memory bits are constructed in pairs to allow sharing of a bit line contact. The sharing of the bit line contact significantly reduces the overall cell size. Typically, the memory bit pair includes an active area (AA), a pair of word lines, a bit line contact, a metal or polysilicon bit line, and a pair of cell capacitors.

The bit line pitch, i.e., the width of the bit line plus the distance between adjacent bit lines, typically determines the active area pitch and the capacitor pitch. The active area width is typically adjusted to maximize the transistor drive and minimize the transistor-to-transistor leakage.

The word line pitch typically determines the space available for the bit line contact, the transistor length, the active area space, and the capacitor length. Each of these dimensions must be optimized to maximize device capacitance, minimize device leakage and maximize process yield.

As semiconductor devices become increasingly smaller, the active area pitch, the bit line pitch, and the word line pitch decrease accordingly. The segmented line mask patterns that define the features likewise are smaller and become increasingly difficult to print because of line shortening effects. Moreover, the active area, bit line and word line mask patterns not only include lines and spaces, which are used in the array areas of these levels, but also include small isolated spaces, which likewise are difficult to print because of the limited size of the open areas that can be printed using the masks, as well as larger sized features used in the support circuitry regions.

To form such finer lines and spaces patterns, a phase-shifting mask is used. The optical phase of light transmitted through some or all of the mask is changed by changing the thickness of various regions of the mask, either by depositing additional transparent material where needed or by removing a thin layer from the mask at specific locations, thereby selectively adjusting the transmitted optical phase at these locations. The phase-shifting mask diffracts the light transmitted by the mask pattern and causes it to interfere destructively or constructively based on the location on the mask pattern, thereby increasing the depth of focus and allowing for the printing of finer lines and spaces patterns.

Typically, an attenuated phase-shift mask (PSM) is used to print the active area pattern as well as other patterns. The dark areas of the mask typically transmit the incident light at a reduced intensity but with a 180 degrees phase shift relative to the clear areas of the mask so that the light transmitted by the dark areas interfere with the light transmitted by the clear areas. The use of attenuated phase-sift masks, however, requires off-axis illumination (OAI) and thus cannot be carried out using standard projection printing systems.

As an alternative, an alternating phase-shift mask may be used in which the light is transmitted only by the clear regions on the mask and in which adjacent clear regions have respective phase shifts of 0 and 180 degrees. The light diffracted into the line regions between the clear regions interfere destructively to improve the image contrast as well as the resolution and depth of focus. However, the active area, bit line and word line masks have patterns that include at lease one array area formed of equal lines and spaces as well as one or more support areas formed of various other patterns. At the ends of the array region, for example, the clear spaces between the solid lines merge so that if an alternating phase-shift mask is used, a space with a 0 degree phase change would intersect with a space having a 180 degree phase change.

To prevent the intersection of two spaces having different phases, one or more dark regions must be included at the ends of the lines to separate the two types of clear areas. However, the patterns printed using such a mask have lines that are shorted to each other and thus would require a second exposure using another mask pattern, typically a standard chrome-on-glass mask pattern, to remove the segments creating the shorts. Additionally, the layout in the support region may also require a double exposure. The double exposure required to incorporate an alternating phase-shift mask pattern requires an additional mask-to-mask alignment step that increases the possibility of introducing alignment errors as well as increasing fabrication costs and personnel expense. The added mask level also increases the possibility of introducing defects. As a result, the use of alternating phase-shift masks are limited to mask levels having only array type patterns that require only a single exposure or to mask levels in which the added cost of a double exposure step cannot be avoided.

It is therefore desirable to provide an alternating phase shift mask pattern that may be used to print a given mask level using only a single exposure.

SUMMARY OF THE INVENTION

The present invention provides a deep trench pattern, an active area pattern, a bit line pattern and a word line pattern that are arranged such that the active area pattern, the bit line pattern and the word line pattern may each be printed using a single exposure.

In accordance with an aspect of the invention, a lithographic mask pattern is provided that includes at least one adjacent pair of spaces and a first substantially opaque feature disposed between the adjacent pair of spaces. One space of the adjacent pair of spaces transmits light with an opposite phase shift to that of another space of the adjacent pair of spaces. A connector region is incorporated in the mask pattern between ends of the first substantially opaque feature and a second substantially opaque feature such that the adjacent pair of spaces do not intersect one another. A portion of the mask pattern is located atop a previously defined trench region such that the trench region prevents the first substantially opaque feature and the second substantially opaque feature from shorting to one another.

According to another aspect of the invention, a lithographic mask patterned is provided that includes a trench pattern and upon which is printed a further lithographic mask pattern that includes at least one adjacent pair of spaces and a first substantially opaque feature disposed between the adjacent pair of spaces. One space of the adjacent pair of spaces transmits light with an opposite phase shift to that of another space of the adjacent pair of spaces. At least one connector region is incorporated between ends of the first substantially opaque feature and a second substantially opaque feature such that the adjacent pair of spaces do not intersect one another. At least one trench region of the trench pattern is located beneath the portion of the further lithographic mask pattern such that the trench region prevents the adjacent pair of lines from shorting to one another.

According to a further aspect of the invention, a first lithographic mask pattern includes a trench pattern and a second lithographic mask pattern includes at least one adjacent pair of spaces and a first substantially opaque feature disposed between the adjacent pair of spaces. The mask patterns are provided in the manner described above.

In accordance with a still further aspect of the invention, a lithographic mask pattern of a mask level is provided. The mask pattern includes an array region comprised of at least one lines and spaces pattern. One space of each adjacent pair of spaces of the lines and spaces pattern transmits light with an opposite phase shift to that of another space of the adjacent pair of spaces. A respective landing pad region, is incorporated in the lines and spaces pattern at an end of at least two lines of the lines and spaces pattern such that a further mask pattern of the mask level may be aligned thereto. Adjacent pairs of spaces of the lines and spaces pattern are thereby prevented from intersecting one another on the mask pattern.

In accordance with yet a further aspect of the invention, a lithographic mask pattern of a mask level is arranged. The mask pattern includes an array region that is comprised of at least one lines and spaces pattern and has a support region comprised of further patterns. One space of each adjacent pair of spaces of the lines and spaces pattern transmits light with an opposite phase shift to that of another space of the adjacent pair of spaces. At one end of the array region, first spaces of the lines and spaces pattern having a same phase shift are arranged to extend into the support region, and remaining spaces of the lines and spaces pattern having an opposite phase shift are terminated. At another end of the array region, the remaining spaces of the lines and spaces pattern are arranged to extend into the support region, and the first spaces of the lines and spaces pattern are terminated.

According to yet another aspect of the invention, a pattern is printed on a substrate using an optical projection system. A lithographic mask pattern provided in the manner described above is irradiated with a single exposure of a light source, and the light transmitted through the lithographic mask is projected onto the substrate using the optical projection system.

An additional aspect of the invention includes a lithographic mask having a mask pattern as described above.

According to still additional aspect of the invention, deep trench structures are formed within a semiconductor substrate. At least one first deep trench is formed within an array region of the semiconductor substrate, and at least one second deep trench is formed within a support region of the semiconductor substrate. A dialetric film is formed along side walls of the first deep trench and the second deep trench. The first deep trench and the second deep trench are filled with first doped polysilicon. At least one buried strap region is formed adjacent to the first deep trench, and at least one gate contact region is formed within the first deep trench. The first doped polysilicon is removed from an upper portion of the second deep trench. Portions of the semiconductor substrate are etched to form at least one isolation trench that at least adjoins the first deep trench. The isolation trench and the upper region of the second deep trench are filled with a further dialetric material.

The foregoing aspects, features and advantages of the present invention will be further appreciated when considered with reference to the following description of the preferred embodiments and accompanying drawings.

DETAILED DESCRIPTION

Figure 1A:
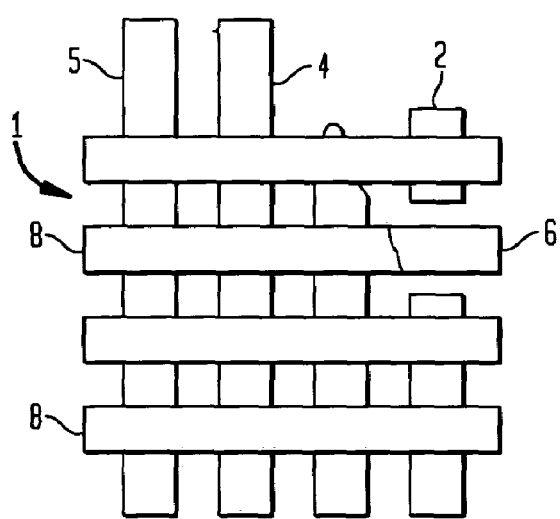
FIGS. 1A and 1B illustrate, in plan view, a known memory array architecture.
Figure 1B:
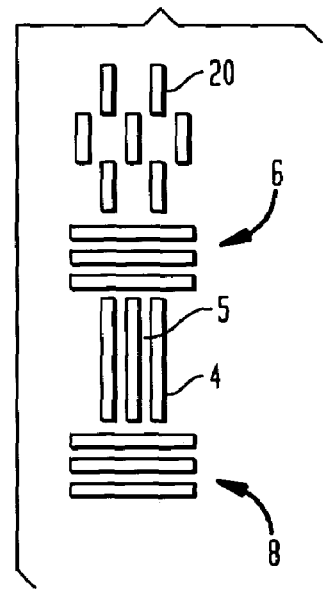

FIGS. 1A and 1B illustrate, in plan view, a known DRAM memory cell array comprised of plural memory cells, typically a trench-based DRAM cell array known as an eight square feature or 8F2 cell. Examples of such DRAM cells and processes for the fabrication are described in U.S. application Ser. No. 09/888,202, filed Jun. 22, 2001, the disclosure of which is incorporated herein by reference.

FIG. 1A shows several mask patterns of the known memory cell array superimposed on one another. FIG. 1B shows each mask pattern of FIG. 1A separately, namely FIG. 1B represents the view of FIG. 1A at four different depths. The topmost pattern of FIG. 1B illustrates an arrangement of a plurality of deep trenches 20. The second pattern from the top in FIG. 1B illustrates the arrangement of the active areas 6 in which are formed the doped junctions used for connection to the pass transistors. The third pattern from the top illustrates the arrangement of the gate contact patterns or word lines 4, 5 of the cell array, and the bottom pattern illustrates the arrangement of the bit lines 8 of the array.

As described above, the four patterns of FIG. 1B are shown in FIG. 1A superimposed atop one another to form the memory cell array 1. The array 1 is comprised of an arrangement of memory cells 2. Each cell 2 is contacted by two word lines 4 and 5 and by one bit line 8. The cell is comprised of an active area (AA) region formed of silicon or polysilicon 6 which is contacted by the bit line 8 which is comprised of a metal, such as tungsten or highly doped polysilicon. Each AA region is electrically isolated from the next AA region by an isolation trench (IT) 10 which is preferably a trench filled with an oxide or other insulator.

The cell 2 is further comprised of a deep trench (DT) region 20 wherein a trench capacitor and a vertical transistor are formed. The deep trench also divides the AA regions. The bit line 8 contacts the AA region on each side of the deep trench at a location where the AA region forms the drain of the pass transistor. The word line 4 passes between the AA regions at a location above the deep trench regions, namely where the AA region is interrupted, to contact the gate of the vertical transistor formed within the trench.

Figure 2:
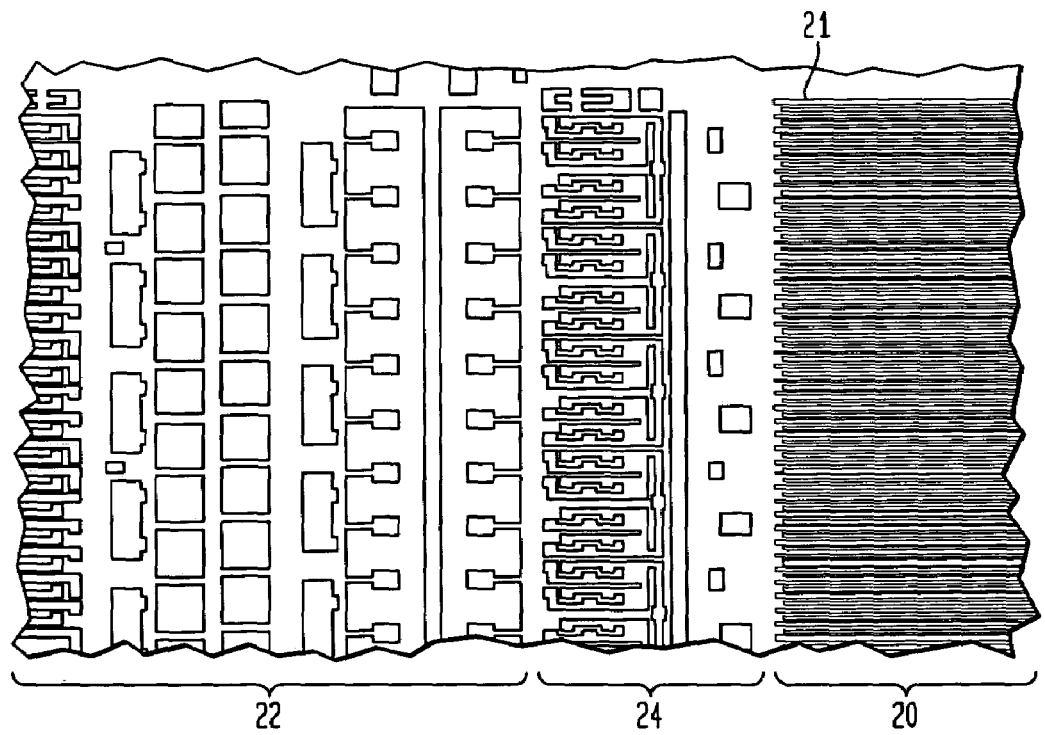
FIG. 2 shows, in plan view, a portion of a known active area pattern.

A typical memory device, however, not only includes a memory cell array region but must also include support circuitry. As an example, FIG. 2 illustrates a known active area mask level pattern that includes an array pattern 20 as well as a support area regions 22 and 24. The array pattern 20 is comprised of a lines and spaces pattern formed of line segments similar to that shown in FIG. 1B. At the end 21 of the array pattern 20, the spaces between the lines intersect.

As memory cell devices become increasingly smaller, the size of the lines and spaces in the array pattern 20 become similarly smaller and become increasingly difficult to print using a standard chrome-on-glass mask. Moreover, though better resolutions could be attained using an alternating phase-shift mask to print a lines and spaces pattern in which adjacent spaces alternate between having a phase shift of 0 degrees and 180 degrees, the intersection of the spaces at the ends 21 of the spaces in the array pattern 20 precludes the use of such an alternating phase-shift mask.

Figure 3A:
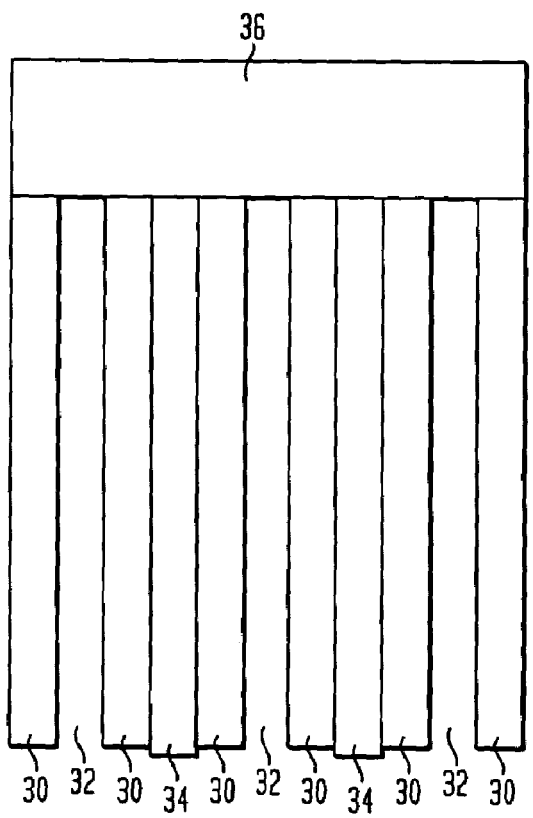
FIGS. 3A and 3B show examples of an alternating phase-shift mask patterns for a lines and spaces array.
Figure 3B:
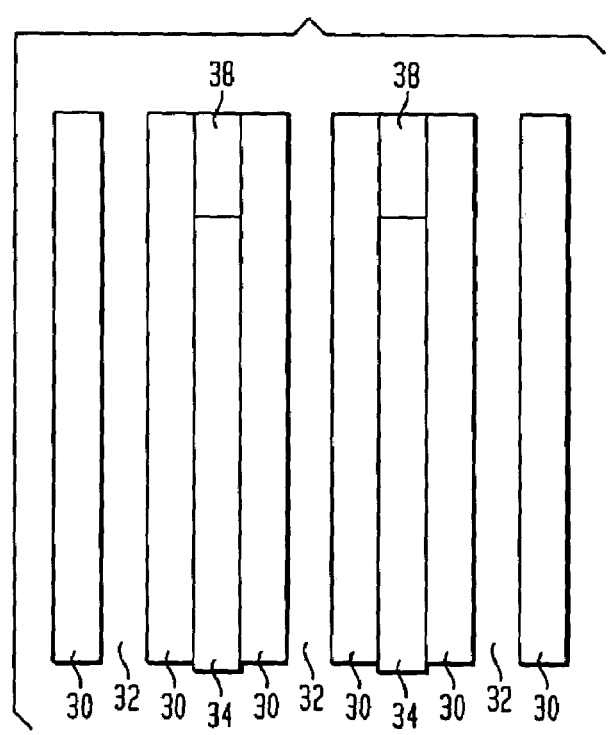

FIGS. 3A and 3B illustrate a portion of a mask pattern at the ends of a lines and spaces array region which are modified to permit the use of an alternating phase-shift mask. As FIG. 3A shows, a plurality of opaque lines 30 are separated by clear spaces 32 and 34 which alternate in phase. Namely, the spaces 32 provide a 0 degree phase shift, and the spaces 34 provide a 180 degree phase shift. To prevent the 0 degree phase shift spaces 32 from intersecting the 180 degree phase shift spaces 34 at the end of the array, an opaque bar 36 is located at the end of the array pattern that intersects the ends of the lines 30. To print the lines and spaces array, the array is first printed using the alternating phase-shift mask to print the pattern shown in FIG. 3A. Thus, the bar 36 is also initially printed and would ordinarily short out all of the lines 30. However, a second exposure is then carried out, typically using an ordinary chrome-on-glass mask pattern, that removes the bar pattern 36 and which may also be used to print the support area patterns.

FIG. 3B illustrates an alternative layout for the ends of the array pattern. Here, the ends of the 0 degree phase shift clear spaces 32 remain open and are permitted to intersect, and the ends of the 180 degree phase shift clear spaces 34 are interrupted by opaque end segments 38 each of which merges two of the opaque lines 30 that are adjacent to the 180 degree phase shift space 34. Alternatively, the 180 degree phase shift spaces are permitted to intersect, and the end pieces interrupt the ends of the 0 degree shift spaces. Because only the spaces having the same phase shift are permitted to intersect, the array may be printed using the alternating phase-shift mask. The wafer is then exposed a second time to remove the end segments as described above with reference to FIG. 3A.

The known use of a double exposure to print a respective mask level, however, requires that the two mask levels be accurately aligned to each other so that all of the bar 36 or segments 38 is removed to prevent the shorting of the lines of the array to each other. The two mask levels must also be accurately aligned to prevent too much of the lines from being removed together with the bar or line segments and possibly cause some of the memory cells to fail. The additional alignment step also requires additional processing time including increased use of the projection printers and process line operators. Moreover, as the feature sizes become increasingly smaller, the alignment tolerances likewise decrease which increases the possibility of a manufacturing error.

Figure 4:
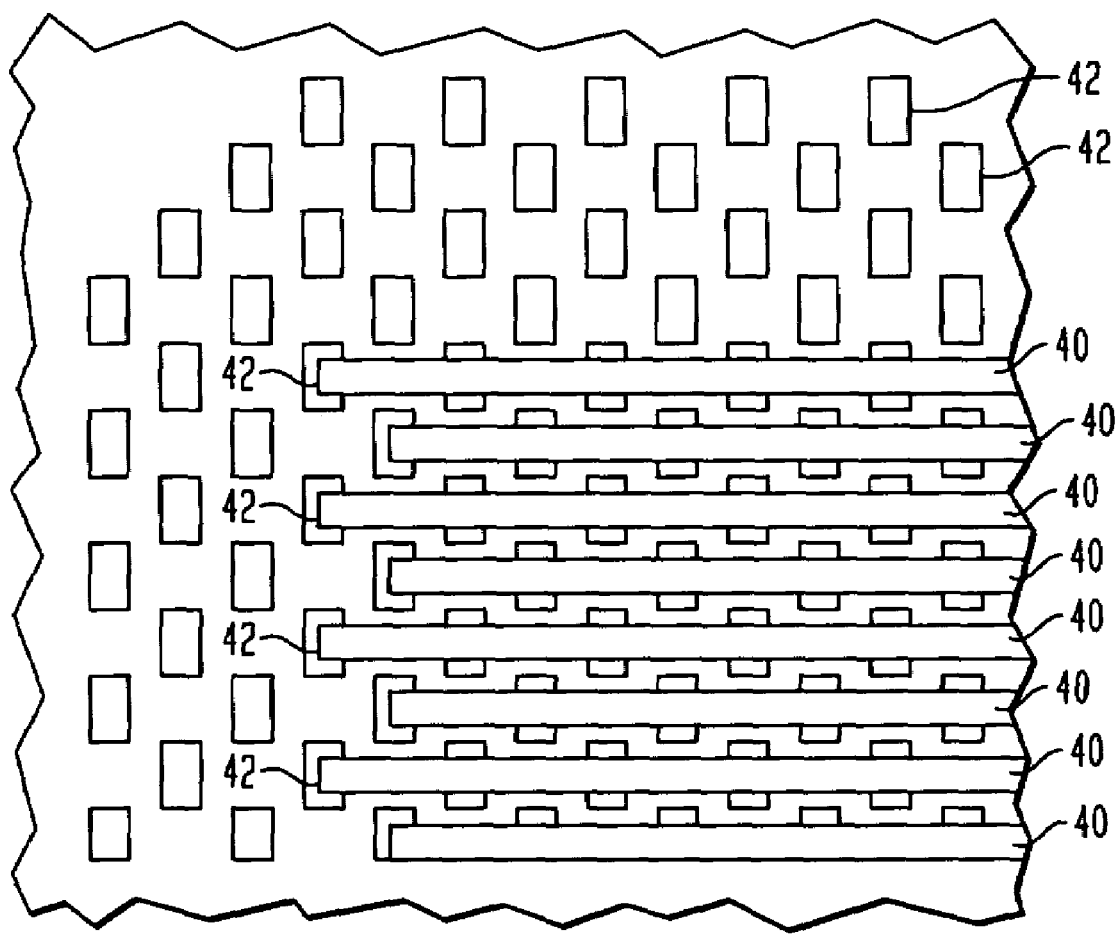
FIG. 4 illustrates an example of an end of a lines and spaces pattern superimposed atop a deep trench pattern in accordance with an embodiment of the invention.

FIG. 4 shows an example of an end portion of a lines and spaces pattern, such as an active area lines and spaces pattern that is superimposed atop a trench pattern, such as a deep trench pattern. The deep trench regions 42 of the deep trench pattern divide the active area lines 40 into segments to that each active area extends from one deep trench region 42 to another deep trench region 42.

The present invention uses the deep trench regions that divide the active areas to also separate the active areas from the regions printed by the bar or segments added to the end of the mask pattern. In accordance with an embodiment of the invention, a lines and spaces array that defines the active area is printed by a single exposure using an alternating phase-shift mask to permit smaller resolutions for the printed lines and spaces. The ends of the lines of one mask pattern are merged in the manner shown in FIG. 2A or 2B so that spaces of different phase shifts do not intersect. However, to avoid the need for a double exposure, the deep trenches located beneath the ends of the lines are configured to interrupt the bar or connection pieces that merge the lines.

Figure 5A:
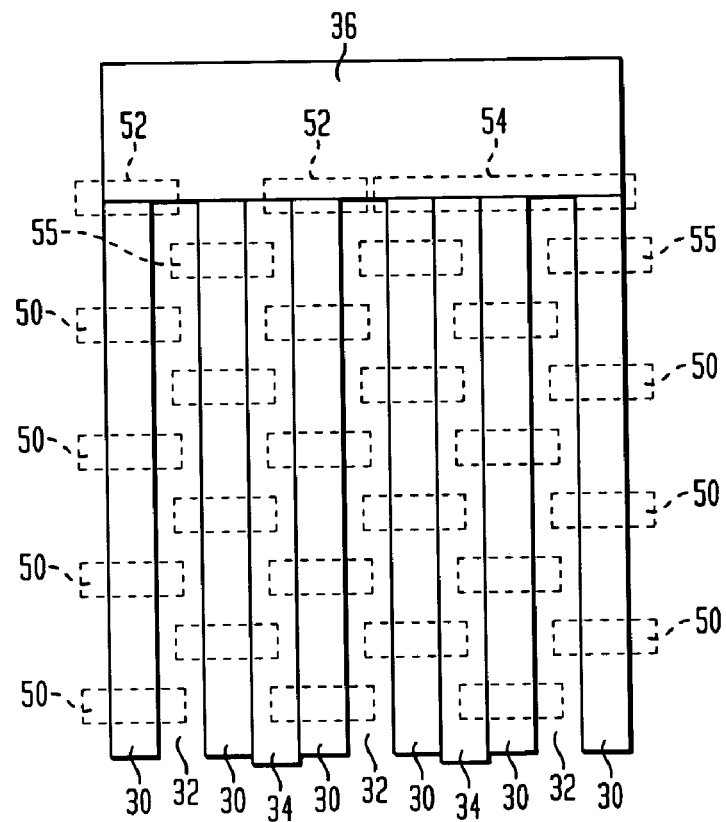
FIGS. 5A and 5B show examples of alternating phase-shift mask array superimposed atop a deep trench pattern in accordance with an embodiment of the invention.
Figure 5B:
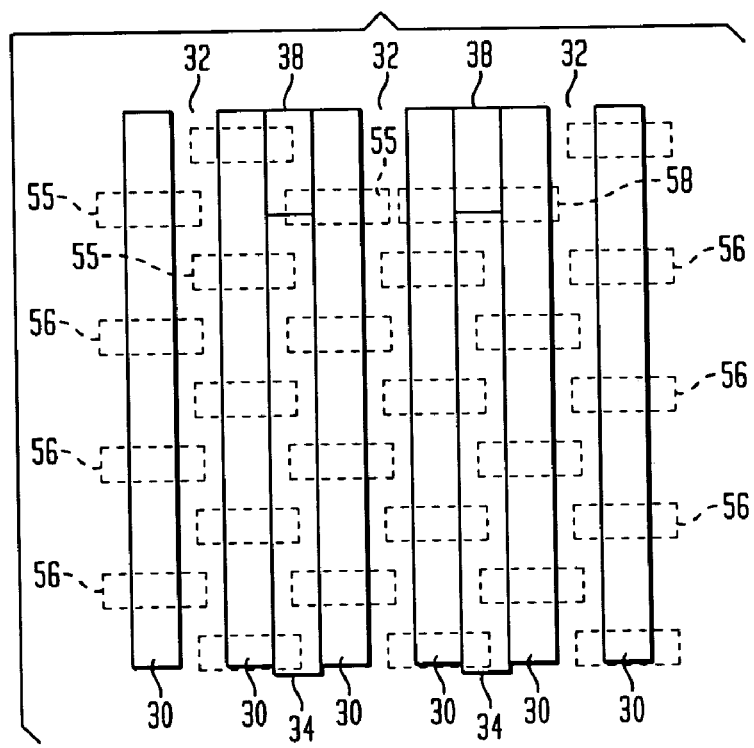

FIGS. 5A and 5B illustrate the lines and spaces array patterns shown in FIGS. 2A and 2B, respectively, superimposed atop deep trench regions that are arranged to interrupt or remove part or all of the bar 36 or connection piece 38. In FIG. 5A, a plurality of trenches 50 are arranged in the known manner. Additionally, trenches 52 are disposed in a manner that prevents the lines 30 from being shorted to one another by the bar 36. With this arrangement, however, the active area on only one side of deep trench 55 may be used.

As an alternative arrangement, a deep trench 54 interrupts two or more, or possibly all of, the lines 30 from the bar 36. As a result, the active areas on both side of the deep trenches 55 nearest the deep trench 54 may be used. Any devices formed within the deep trench 54 are now suitable to serve as part of the memory array. However, the word lines that are subsequently formed do not contact the gate region of the deep trench 52 or the deep trench 54.

FIG. 5B illustrates the alternative mask pattern shown in FIG. 2B superimposed over an arrangement of deep trench regions 56 which form a plurality of active areas between the deep trenches. Deep trenches 55 and 57 prevent the lines 30 from being shorted to one another by the connection piece 38. However, as described above, only the active area on one side of deep trench 55 may be used. Alternatively, a single deep trench 58 serves to isolate the lines 30 from the connection piece 38.

Figure 6:
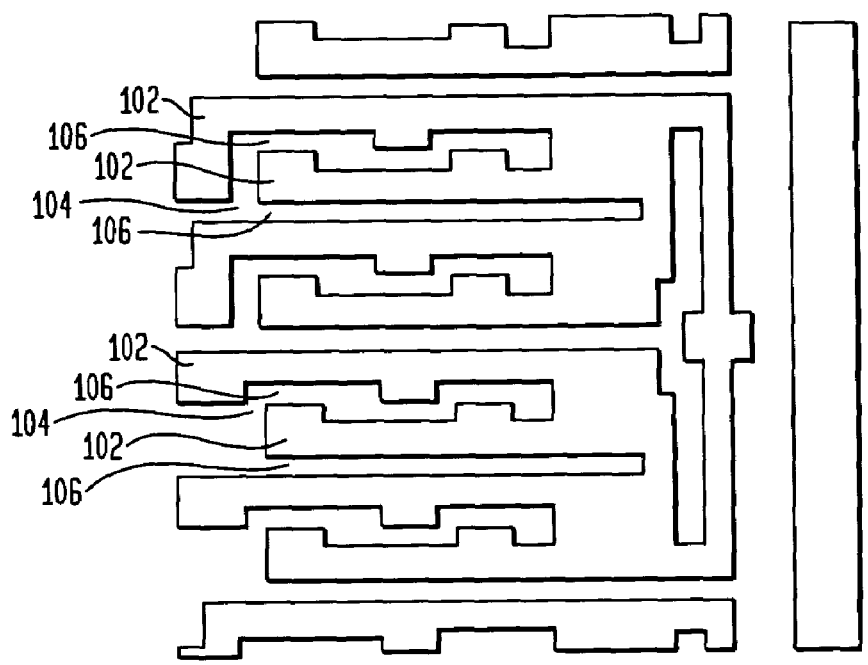
FIG. 6 illustrates, in plan view, a portion of a known support region pattern.

It is also desirable to use an alternating phase-shift mask to print part or all of the pattern for the support region, such as the portion 24 of the support region shown in FIG. 2. However, as with the lines and spaces pattern, the support region also includes clear spaces that merge at the ends of various line features so that if an alternating phase-shift mask is used, a space having a 0 degree phase change would intersect with a space having a 180 degree phase change. As an example, FIG. 6 illustrates a portion of a support region in which various substantially opaque or solid features 102 are separated by clear regions 106. At the ends of the solid regions 102, the clear regions 106 merge at locations 104 and preclude the use of alternating phase-shift masks.

The present invention therefore enables the use of alternating phase-shift masks to print the support region by incorporating an opaque or substantially opaque connector region that connects two or more opaque or substantially opaque features so that adjacent clear space regions may have opposing phase shifts. To prevent the two features from shorting to one another, underlying deep trench regions are incorporated into the support region, and the connectors are disposed above the deep trenches to prevent the solid features of the support pattern from intersecting one another.

Figure 7:
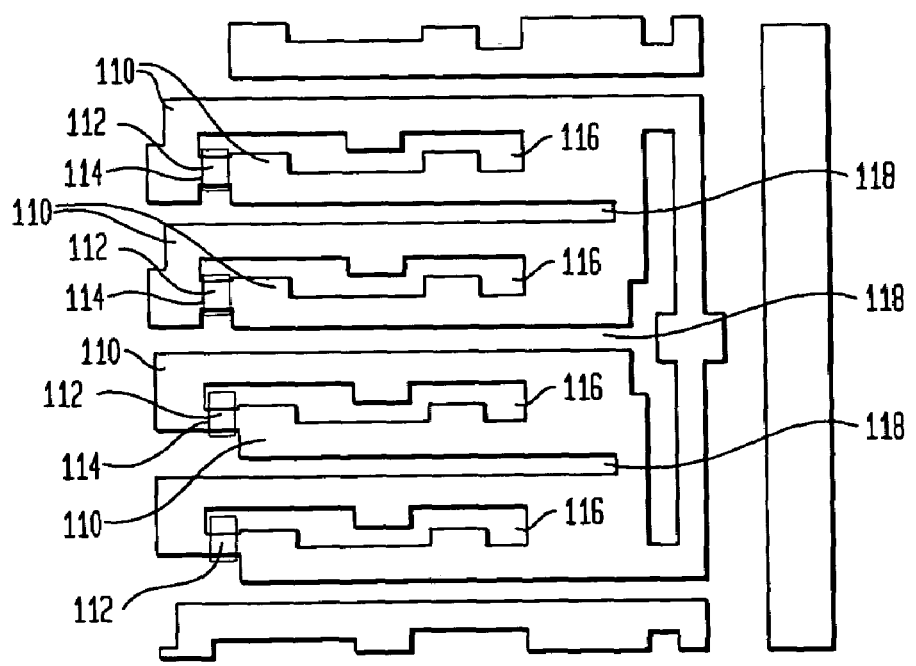
FIG. 7, shows, in plan view, an example of an alternating phase-shift mask pattern for a support region which is superimposed atop a deep trench pattern in accordance with another embodiment of the invention.

FIG. 7 illustrates an example of a portion of a support region pattern in which two adjacent substantially opaque features 110 are connected by a substantially opaque segment 112. The support region may therefore be printed using an alternating phase-shift mask in which the closed-off clear regions 116 have either a 0 degree phase shift or a 180 degree phase shift, and the open ended clear regions 118 have the other of the 0 degree phase shift and the 180 degree phase shift without regions of opposing phase shifts intersecting.

To prevent the two solid regions 110 from shorting to one another via the connection feature 112, deep trenches 114 are incorporated into the support region. The deep trenches in the support region, however, serve only to prevent the solid features 110 from contacting each other and typically do not include vertical transistors.

FIGS. 8A-8H illustrate a process flow for forming both the deep trenches of the array region as well as the deep trenches that are included in the support region.

Figure 8A:
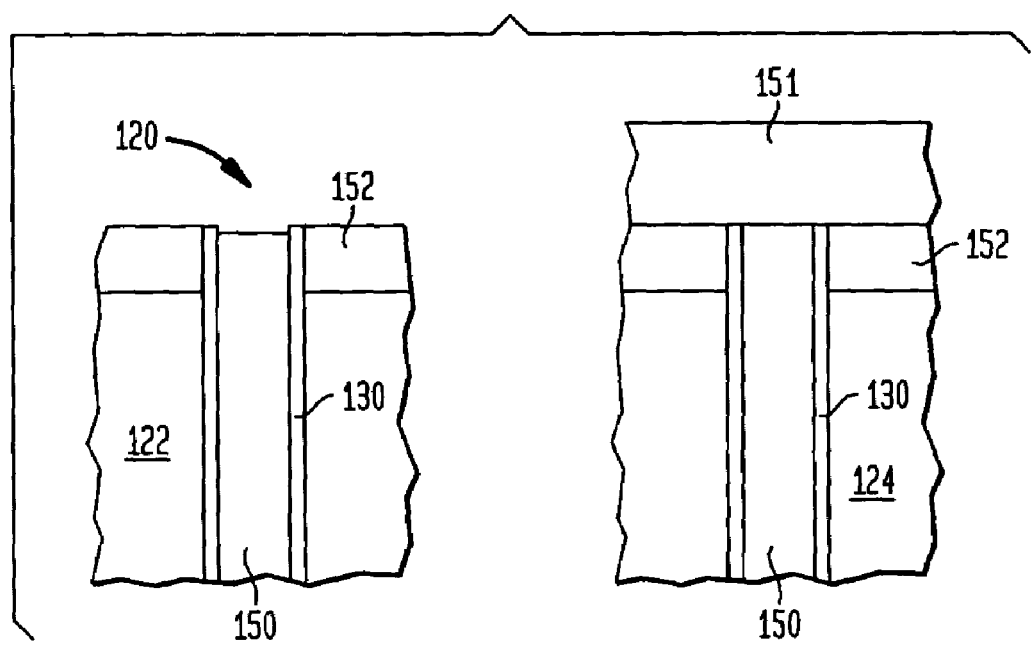
FIGS. 8A-8H illustrates an example of process steps for forming a deep trench device in accordance with the invention.

First, as FIG. 8A shows, a pad oxide layer (not shown) and a pad nitride layer 152 are deposited atop the substrate, and then a hard mask layer (not shown) is deposited atop the pad nitride layer 152. The hard mask layer and the pad nitride layer are then patterned and etched using a lithographic step, and the hard mask layer is then used to mask the etching of deep trenches 120. In accordance with the invention, the deep trenches 120 are formed both in the array region 122 as well as in the support regions 124.

Next, the hard mask layer is removed, and a doped glass layer is deposited along the walls and bottom of the trenches as well as atop the nitride layer 152. A further lithographic step is then carried out to pattern and remove the doped glass from atop the nitride layer and from the walls of the upper portion of the trenches. An oxide cap is then deposited over the remaining portion of the doped glass, as well as over the walls of the rest of the trench and atop the nitride layer, and a drive-in step is carried out to drive dopants from the doped glass and form a buried plate. The oxide cap and the doped glass are then removed, and the walls of the trenches are lined with a node dielectric layer (not shown). The lower portion of the trench is then filled with polysilicon to form a lower part of a polysilicon region 150, and the node dielectric is then removed from the part of the trenches that is above the polysilicon. The top surface is then planarized to remove any portion of the polysilicon that is atop the nitride layer.

As FIG. 8A shows, a trench collar oxide layer 130 is then deposited and etched back to remove any portion of the trench collar oxide layer that is atop the nitride layer 152. Then, the remainder of the polysilicon layer 150 is next deposited, and the device is again planarized to remove any polysilicon that is atop the nitride layer 152. The nitride layer 152 protects the surrounding silicon during the polysilicon etch step.

Figure 8B:
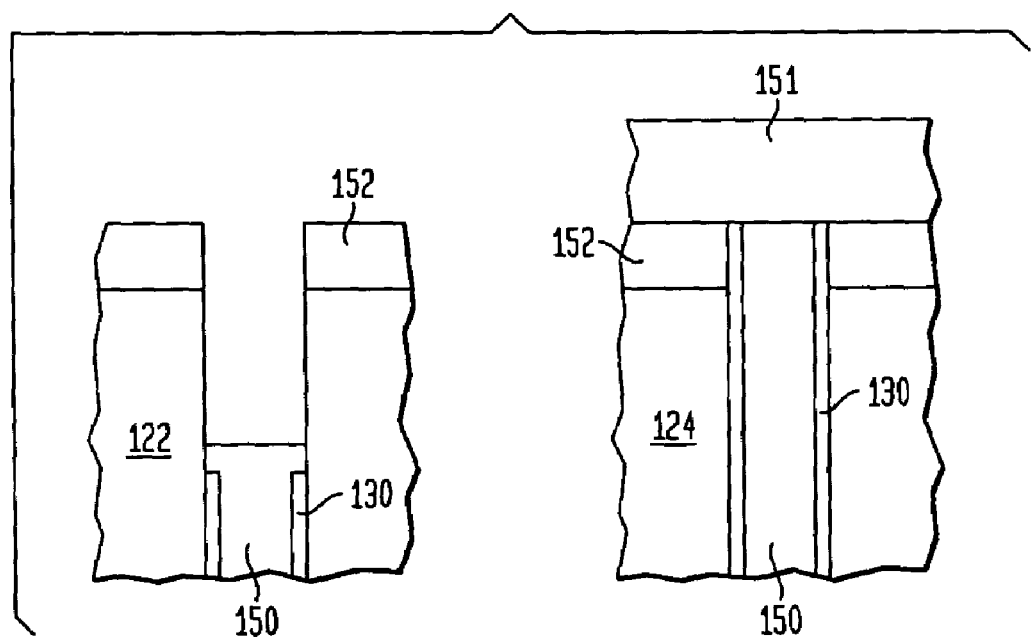

Then, as shown in FIG. 8B, the device is covered with a resist layer 151 which is patterned so that only portions of the array region 122 are exposed. The polysilicon 150 and the trench collar oxide 130 in the array region 122 are then recessed back to a desired depth, preferably using a wet etch step. The oxide recess forms a divot at a location where the collar oxide is removed below the level of polysilicon fill 150. An optional thin oxidation or nitride deposition can also be performed. The divot is then filled by again filling the trench with further polysilicon and recessing the polysilicon to a desired level. The polysilicon region is subsequently doped in high temperature processing steps by the region 150 and the dopant subsequently out-diffuses into the substrate to form a buried strap region (not shown). The resist layer 151 is then removed.

Figure 8C:
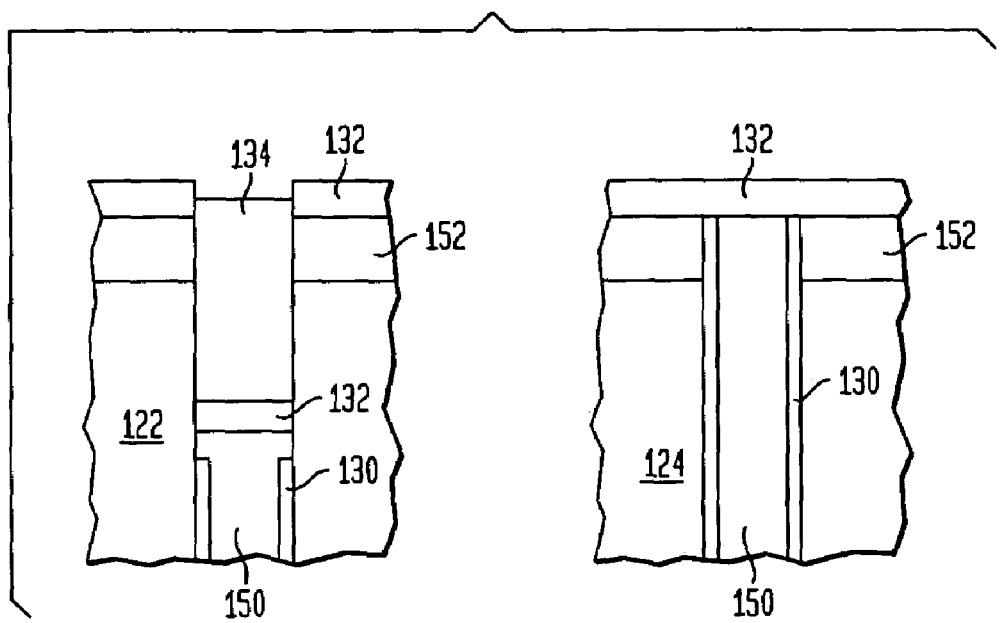

A trench top oxide layer 132 is then formed, as FIG. 8C shows, by first forming a sacrificial oxide layer (not shown) on the sidewalls of the deep trench 120 of the array region 122. The trench top oxide (TTO) layer 132 is formed on the horizontal surfaces using a high density plasma (HDP) deposition process followed by a wet etch. Optionally, a nitride wet etch can be performed to remove the overhang of the nitride layer 152 in the trench 120. After formation of the TTO layer 132, the sacrificial oxide layer is removed, thus providing a clean deep trench sidewall surface for subsequent growing of a gate oxide layer 136. After the gate oxide layer 136 is formed, a gate polysilicon layer 134 is deposited to fill the deep trench of the array region 122 and is polished using a chemical mechanical polish (CMP) step and then recessed. The deep trench of the array region is overfilled with polysilicon, and the CMP step removes any polysilicon deposited atop the nitride layer 152 or atop the TTO layer 132. The polysilicon layer 134 is then etched below the surface of the bulk silicon surrounding deep trench 120. The recess depth is a matter of design choice provided that the recess is within the junction depth of the drain to insure junction to gate overlap.

Figure 8D:
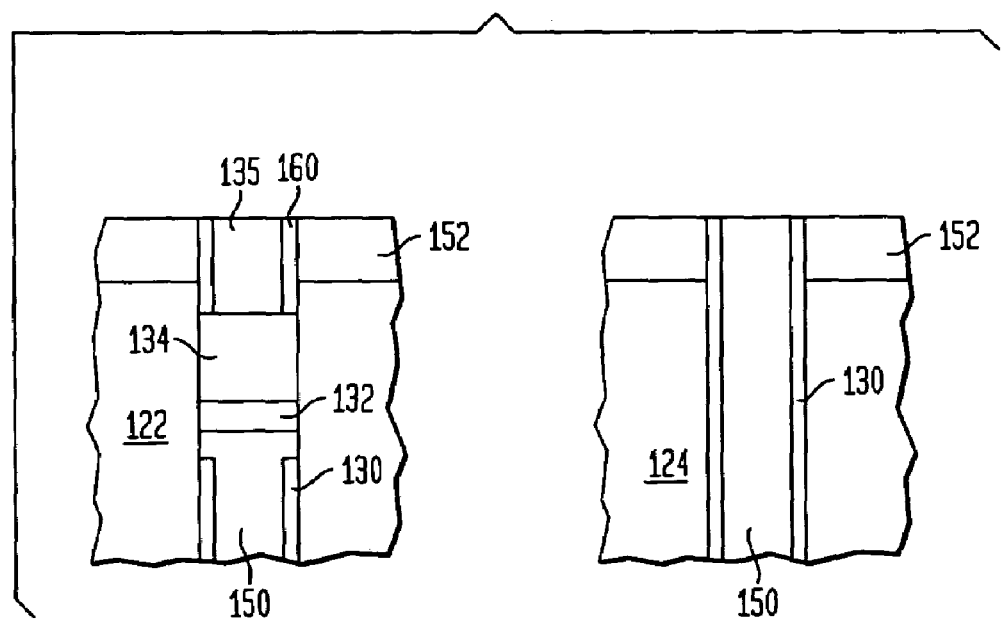

Next, as shown in FIG. 8D, the exposed surfaces of the bulk silicon and the gate polysilicon 134 are oxidized to form a thin oxide layer (not shown). A nitride liner layer is then deposited and is etched back to remove the horizontal portions of the nitride liner layer and form a nitride spacer 160 within the deep trenches of the array region. This step is followed by an oxide clean to remove any oxide from the exposed surface of gate polysilicon layer 134. The TTO layer 132 formed atop the nitride layer 152 may also be removed concurrently if it was not stripped away earlier. Additional polysilicon is deposited atop the gate polysilicon region 134, resulting in a polysilicon stud 135 which preferably becomes integral with the gate polysilicon 134. Preferably, the polysilicon stud layer 135 is first overfilled and then wet etched back or, alternatively, is subjected to a CMP planarizing step.

Figure 8E:
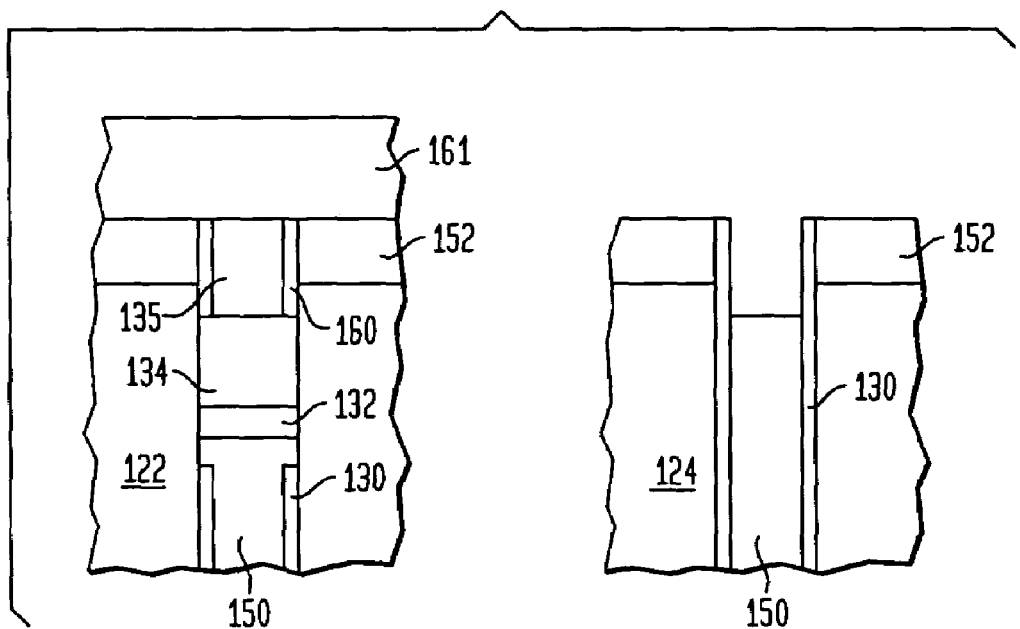

Then, as FIG. 8E shows, a further resist layer 161 is deposited and is patterned to expose the deep trenches of the support regions 124 and to cover the deep trenches of the array region 122 so that processing may now be carried out on the deep trenches of the support region. The upper portion of the polysilicon layer 150 of the deep trenches of the support region 124 is then etched below the surface of the bulk silicon surrounding the deep trench. The resist layer 161 is then removed.

Figure 8F:
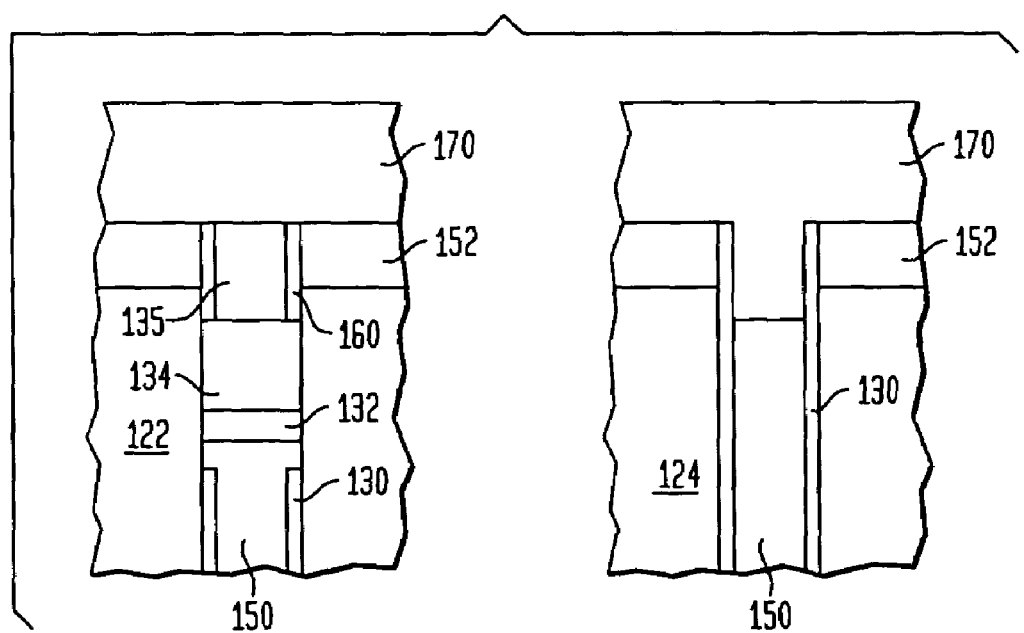

Next, as shown in FIG. 8F, an insulating layer, such as a layer of borosilicate glass (BSG), is deposited atop the nitride layer 152 and atop the bulk silicon as well as to fill in the deep trenches of the support region 124. The insulating layer may serve as a hard mask layer to protect the trenches during subsequent active area processing or, alternatively, another hard mask layer is deposited atop the insulating layer.

Figure 8G:
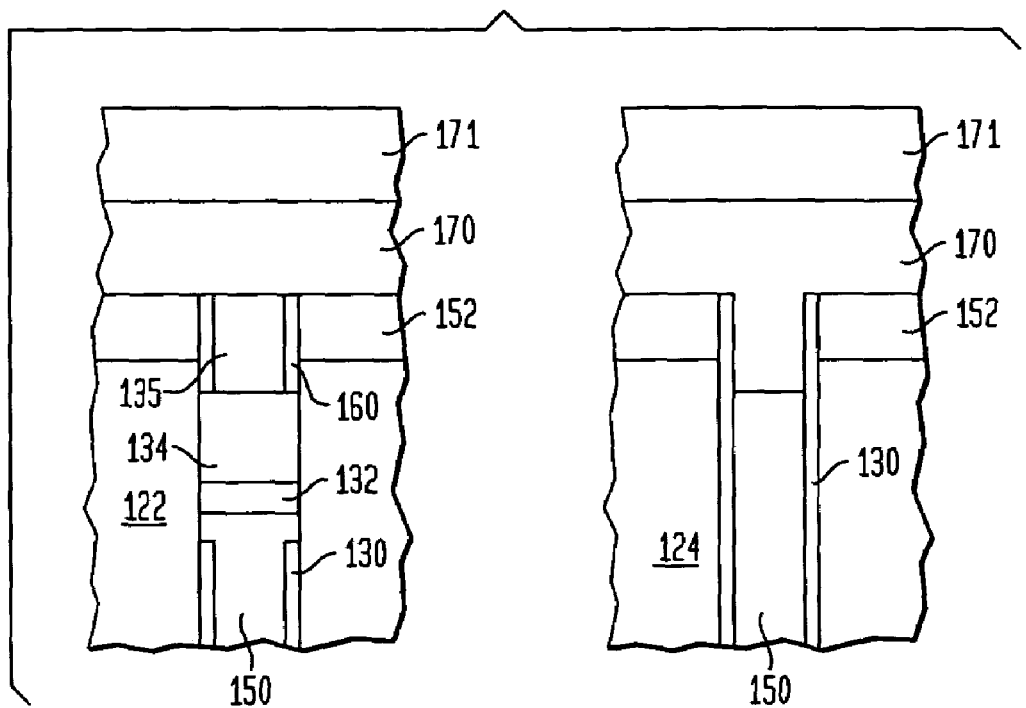

Then, as FIG. 8G shows, another resist layer 171 is deposited and patterned, and the exposed portions of the insulating layer 170 are etched. The remaining portions of the insulating layer 170 then serve as an etch mask for the etching of isolation trenches (not shown). The portions of the substrate that are exposed by the openings in the insulating layer 170 are etched during this etch step and may include portions of the deep trenches.

Figure 8H:
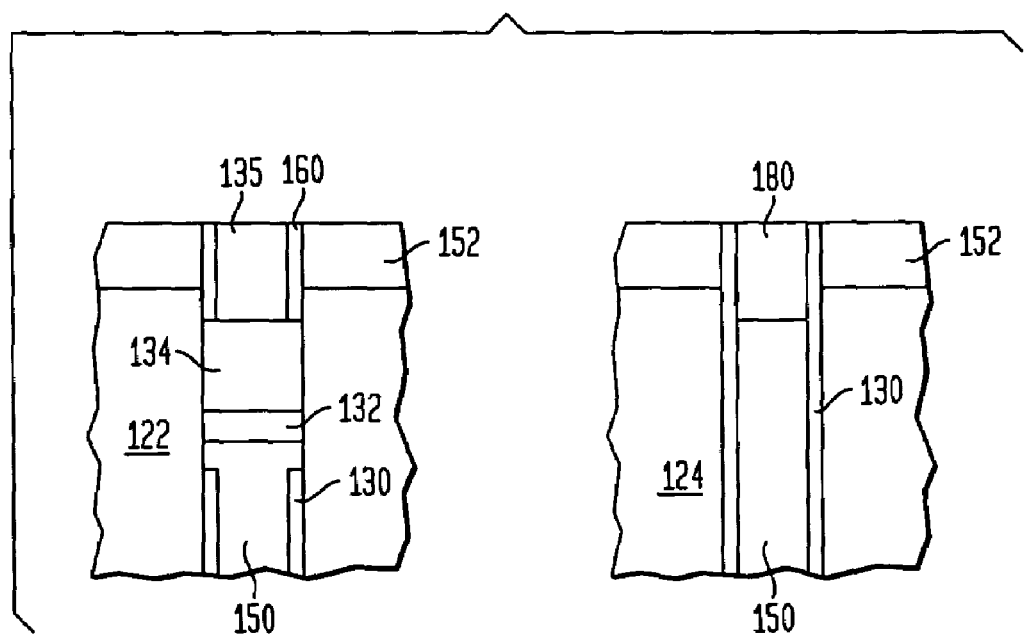

Next, as illustrated in FIG. 8H, the layer 170 is removed from atop the nitride layer 152 and from atop the bulk silicon as well as from the upper portion of a deep trenches of the support region 124. An insulating oxide 180 is then deposited which fills the upper portion of the deep trenches of the support region 124 as well as fills the isolation trenches. The insulating oxide 180 is then planarized to the top of the nitride layer 152.

The devices may then be further processed in a known manner, such as is described in U.S. application Ser. No. 09/888,202, filed Jun. 22, 2001, the disclosure of which is incorporated herein by reference.

Figure 9:
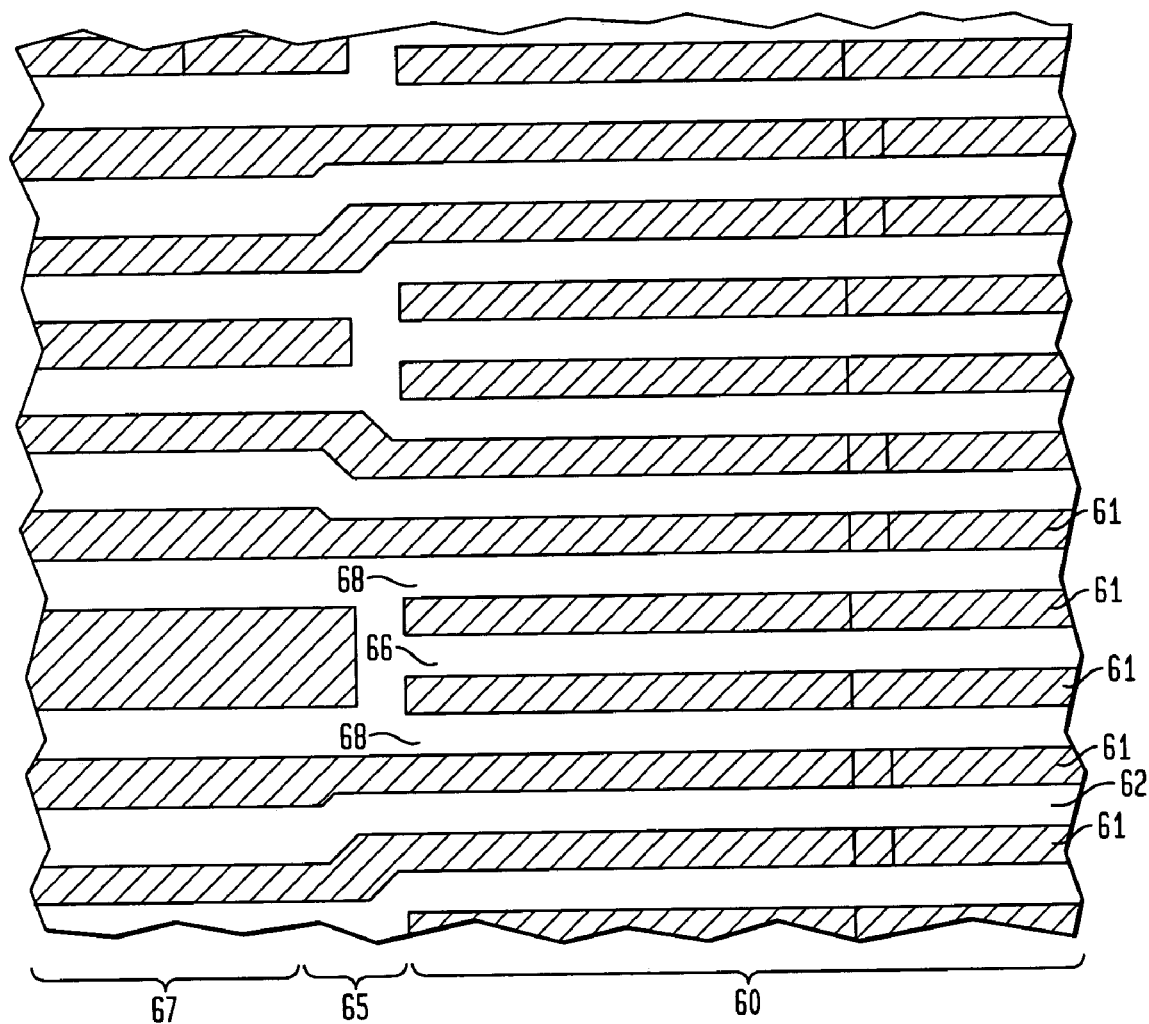
FIG. 9 illustrates a portion of a known bit line (M0) level mask pattern that includes a transition from an array region to a support region.

The present invention also permits the use of alternating phase-shift masks to print bit line and word line patterns. FIG. 9 illustrates an example of a known pattern, such as is used for a bit line (M0) pattern. The array region 60 includes the bit lines in the array section that are formed by lines 61 and spaces 62. Also shown is a support region 67 which includes additional circuit elements. A transition region 65 located between the array region 60 and the support region 67, includes lines that terminate as well as lines that connect to the support area 67 and which may be folded. Also, in the transition region 65, one or more of the spaces of the array region may merge into a common region as the bit lines from the array terminate. Thus, though it is desirable to use an alternating phase-shift mask to resolve the lines and spaces in the array region 60, such a mask may not readily be used because spaces having different phase shifts would intersect in the transition region. As an example, when a space 66 has a phase shift of 0 degrees, a space 68 has a phase shift of 180 degrees and would intersect with space 66 in the transition region.

Figure 10A:
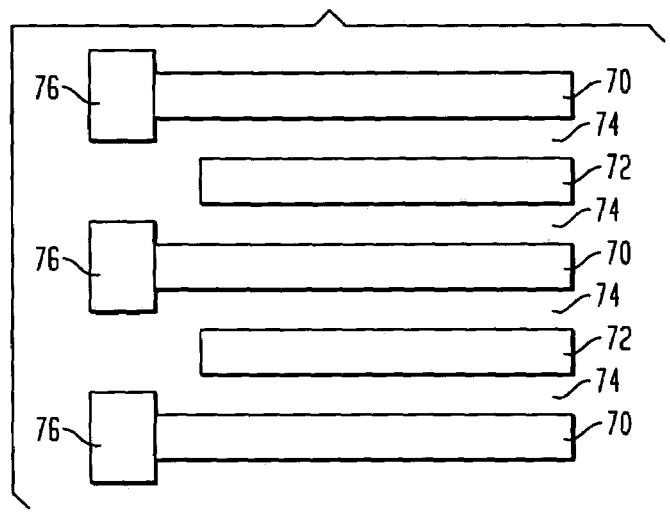
FIGS. 10A and 10B show examples of a portion of an alternating phase-shift mask pattern at an end of a lines and spaces array in accordance with another embodiment of the invention.
Figure 10B:
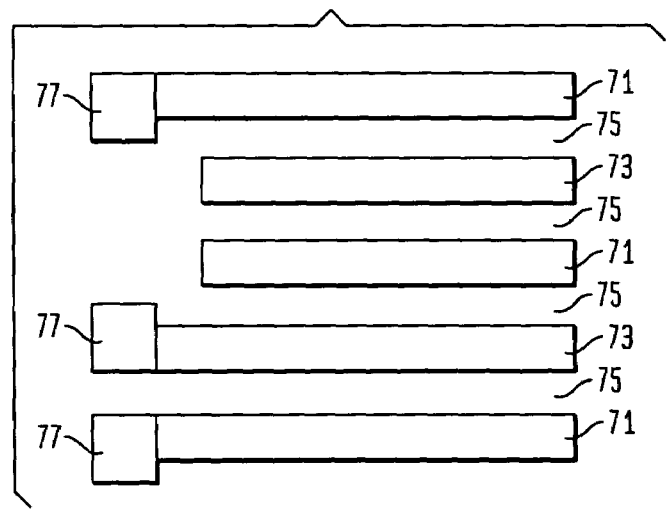

In accordance with another embodiment of the invention, FIGS. 10A and 10B illustrate metal line patterns that are suitable for use with an alternating phase-shift mask by incorporating "landing pads" in some of the spaces at the end of the array pattern in the transition region. FIG. 10A shows a lines and spaces array in which a pair of lines 74 and a pair of lines 78 each merge in the transition region. The lines 74 and 76 are separated by 0 degree phase shift spaces 70 and 180 degree phase shift spaces 72 which alternate between the lines. In the transition region, the lines 70 terminate at landing pads 76 and permit the use of a second mask pattern, such as a standard chrome-on-glass mask pattern, to define the support regions and serve as contact pads for the support region mask. As a result, the alternating phase spaces are not printed in the support regions using the alternating phase-shift mask but, instead, are printed using the mask that defines the support regions. Alternatively, the landing pads may be used to terminate the 180 degree phase shift spaces instead of the 0 degree phase shift spaces.

As a further alternative, shown in FIG. 10B, some of the 0 degree phase shift spaces 71 terminate with landing pads 77 and some of the 180 degree phase shift spaces 73 terminate with landing pads 79. The landing pads are nevertheless arranged in a manner such that adjacent spaces having different phases do not intersect.

Figure 11:
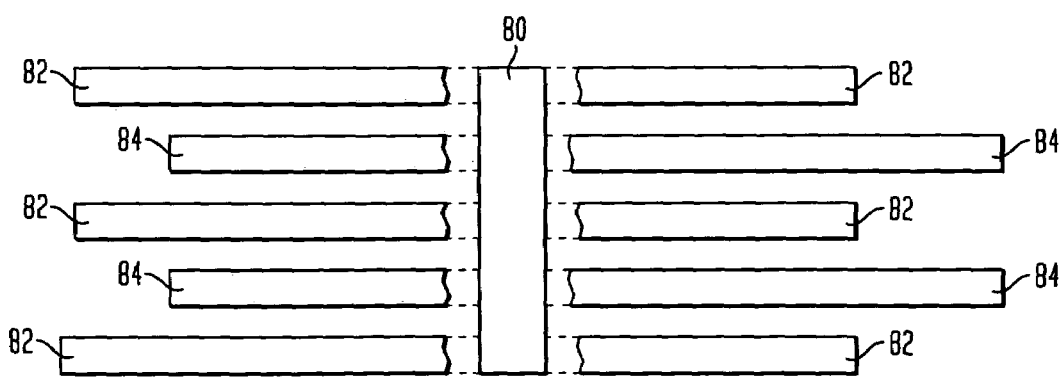
FIG. 11 illustrates a portion of an alternating phase-shift mask pattern at the ends of a lines and spaces array in accordance with yet another embodiment of the invention.

Though the embodiment shown in FIGS. 10A and 10B permit the use of alternating phase-shift masks to define the array pattern of a bit line (M0) or a word line array, two masking steps are still required. As a further alternative, FIG. 11 illustrates another embodiment of the invention in which alternate spaces from the array section 80 extend into the support region. To prevent the 0 and 180 degree phase spaces from intersecting, at one end of the array, the 0 degree spaces 82 extend into the support section, and the 180 degree spaces 84 terminate such that no two spaces on either side of a respective line do not intersect. At the other end of the array, the 180 degree spaces 84 extend into the support section, and the 0 degree phase spaces 82 terminate so that the spaces, on either side of a line do not intersect. The lines of the array are laid out in a manner that permits such an arrangement.

Advantageously, the mask arrangements shown in FIGS. 5A-5B, 7, 10A-10B and 11 permit the use of alternating phase-shift masks with better resolution and greater depth of focus. As a further advantage, the masks arrangements shown in FIGS. 5A-5B and 8 allow the use of alternating phase-shift masks with a single exposure, thereby not requiring an additional alignment step with the associated use of the alignment "budget" and increased operator and processing costs.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of providing a lithographic mask pattern that includes at least one adjacent pair of spaces and a first substantially opaque feature disposed between said adjacent pair of spaces, wherein one space of said adjacent pair of spaces transmits light with an opposite phase shift to that of another space of said adjacent pair of spaces; said method comprising:

incorporating, in said mask pattern, a connector region between ends of said first substantially opaque feature and a second substantially opaque feature such that said adjacent pair of spaces do not intersect one another, and locating a portion of said mask pattern coincident with an additional mask feature representing a trench region, wherein said trench region prevents a printed pattern resulting from said first substantially opaque feature and said second substantially opaque feature from shorting to one another.

2. The method of claim 1 wherein at least a portion of said connector region is coincident with the additional mask feature.

3. The method of claim 1 wherein said lithographic mask pattern includes an array region comprised of at least one lines and spaces pattern, one space of each adjacent pair of spaces of said lines and spaces pattern transmitting light with an opposite phase shift to that of another space of said adjacent pair of spaces, said connector region being incorporated between ends of at least one adjacent pair of lines.

4. The method of claim 3 wherein a portion of at least one of said connector region and said adjacent pair of lines is coincident with the additional mask feature such that said trench region prevents a printed pattern resulting from said adjacent pair of lines from shorting to one another.

5. The method of claim 3 wherein said connector region connects all of said lines at an end of said lines and spaces pattern.

6. The method of claim 3 wherein said connector region comprises a plurality of connectors each connecting a respective pair of lines of said lines and spaces pattern at said end of said pair of lines.

7. The method of claim 3 wherein at least a portion of said connector region and a portion of at least one of said lines are disposed atop said trench region.

8. The method of claim 3 wherein at least two of said lines are disposed atop said trench region.

9. The method of claim 1 wherein said photolithographic mask pattern includes an active area pattern of a memory device.

10. A method of providing a lithographic mask pattern that includes a trench pattern and upon which is printed a further lithographic mask pattern that includes at least one adjacent pair of spaces and a first substantially opaque feature disposed between said adjacent pair of spaces, wherein one space of said adjacent pair of spaces transmits light with an opposite phase shift to that of another space of said adjacent pair of spaces, at least one connector region being incorporated between ends of said first substantially opaque feature and a second substantially opaque feature such that said adjacent pair of spaces do not intersect one another; said method comprising:

locating at least one trench region of said trench pattern coincident with a portion of said further lithographic mask pattern such that said trench region prevents a printed pattern resulting from said adjacent pair of lines from shorting to one another.

11. The method of claim 10 wherein said trench region is disposed beneath at least a portion of said connector region.

12. The method of claim 10 wherein said further lithographic mask pattern that includes an array region comprised of at least one lines and spaces pattern, one space of each adjacent pair of spaces of said lines and spaces pattern transmitting light with an opposite phase shift to that of another space of said adjacent pair of spaces, said connector region being incorporated in said lines and spaces pattern between ends of at least one adjacent pair of lines.

13. The method of claim 12, wherein said at least one trench region of said trench pattern is located beneath a portion of at least one of said connector region and said adjacent pair of lines.

14. The method of claim 12 wherein said trench region is disposed beneath at least a portion of said connector region and a portion of at least one of said lines.

15. The method of claim 12 wherein said trench region is disposed beneath at least two of said lines.

16. The method of claim 10 wherein said lithographic mask pattern comprises deep trench patterns of a memory device.

17. A method of providing a first lithographic mask pattern that includes a trench pattern and a second lithographic mask pattern that includes at least one adjacent pair of spaces and a first substantially opaque feature disposed between said adjacent pair of spaces, wherein one space of each adjacent pair of spaces transmits light with an opposite phase shift to that of another space of said adjacent pair of spaces, said method comprising:

incorporating, in said first lithographic mask pattern, at least one connector region between ends of said first substantially opaque feature and a second substantially opaque feature such that said adjacent pair of spaces do not intersect one another, and disposing at least one Wench region of said trench pattern beneath a portion of said first lithographic mask pattern such that said trench region prevents said adjacent pair of lines from shorting to one another.

18. The method of claim 17 wherein said trench is disposed beneath at least a portion of said connector region.

19. The method of claim 17 wherein said second lithographic mask pattern includes an array region comprised of at least one lines and spaces pattern, one space of each adjacent pair of spaces of said lines and spaces pattern transmitting light with an opposite phase shift to that of another space of said adjacent pair of spaces, and said connector region is incorporated between ends of at least one adjacent pair of lines.

20. The method of claim 19 wherein at least one trench region of said trench pattern is disposed beneath a portion of at least one of said connector region and said adjacent pair of lines.

21. The method of claim 19 wherein said connector region connects all of said lines at an end of said lines and spaces pattern.

22. The method of claim 19 wherein said connector region comprises a plurality of connectors each connecting a respective pair of lines of said lines and spaces pattern at said end of said pair of lines.

23. The method of claim 19 wherein said trench is disposed beneath at least a portion of said connector region and a portion of at least one of said lines.

24. The method of claim 19 wherein said trench is disposed beneath at least two of said lines.

25. The method of claim 17 wherein said first lithographic mask pattern comprises an active area pattern of a memory device, and said second lithographic mask pattern comprises deep trench patterns of said memory device.

26. A method of printing a pattern on a substrate using an optical projection system; said method comprising:
irradiating a lithographic mask with a single exposure of a light source, said lithographic mask having a mask pattern that includes at least one adjacent pair of spaces and a first substantially opaque feature disposed between said adjacent pair of spaces, one space of each adjacent pair of spaces of said lines and spaces pattern transmitting light from said light source with an opposite phase shift to that of another space of said adjacent pair of spaces, a connector region being incorporated in said mask pattern between ends of said first substantially opaque feature and a second substantially opaque feature such that at least an adjacent pair of spaces do not intersect one another, a portion of said mask pattern coincident with a mask pattern defining a trench region of said substrate such that said trench region prevents a printed pattern resulting from said first substantially opaque feature and said second substantially opaque feature from shorting to one another; and
projecting light transmitted through said lithographic mask onto said substrate using said optical projection system.

27. The method of claim 26 wherein at least a portion of said connector region is coincident with said mask pattern defining a trench region.

28. The method of claim 26 wherein said mask pattern is comprised of at least one lines and spaces pattern and has a support region comprised of further patterns, one space of each adjacent pair of spaces of said lines and spaces pattern transmitting light with an opposite phase shift to that of another space of said adjacent pair of spaces, said connector region being incorporated in said lines and spaces pattern between ends of at least one adjacent pair of lines.

29. The method of claim 28 wherein, a portion of a printed pattern of at least one of said connector and said adjacent pair of lines being disposed atop said trench region of said substrate such that said trench region prevents a printed pattern of said adjacent pair of lines from shorting to one another.

30. The method of claim 28 wherein said connector region connects all of said lines at an end of said lines and spaces pattern.

31. The method of claim 28 wherein said connector region comprises a plurality of connectors each connecting a respective pair of lines of said lines and spaces pattern at an end of said pair of lines.

32. The method of claim 28 wherein at least a portion of said connector region and a portion of at least one of said lines are disposed atop said trench.

33. The method of claim 28 wherein at least two of said lines are disposed atop said trench.

34. The method of claim 26 further comprising irradiating a further lithographic mask prior to said irradiating of said lithographic mask, said further lithographic mask including said trench region, and projecting light transmitted through said further lithographic mask onto said substrate using said optical projection system.

35. The method of claim 26 wherein said lithographic mask pattern comprises an active area pattern of a memory device.

36. A method of printing a pattern on a substrate using an optical projection system and upon which is printed a further pattern that includes at least one adjacent pair of spaces and a first substantially opaque feature disposed between said adjacent pair of spaces, one space of said adjacent pair of spaces transmitting light with an opposite phase shift to that of another space of said adjacent pair of spaces, at least one connector region being incorporated in said further pattern between ends of said first substantially opaque feature and a second substantially opaque feature such that said adjacent pair of spaces do not intersect one another; said method comprising:
irradiating a lithographic mask with a light source, said lithographic mask having a trench pattern that includes at least one trench region that is disposed beneath said further pattern such that said trench region prevents a printed pattern resulting from said first substantially opaque feature and said second substantially opaque feature from shorting to one another; and
projecting light transmitted though said lithographic mask onto said substrate using said optical projection system.

37. The method of claim 36 wherein said trench is disposed beneath at least a portion of said connector region.

38. The method of claim 36 wherein said further pattern includes an array region comprised of at least one lines and spaces pattern, one space of each adjacent pair of spaces of said lines and spaces pattern transmitting light with an opposite phase shift to that of another space of said adjacent pair of spaces, said at least one connector region being incorporated in said lines and spaces pattern between ends of at least one adjacent pair of lines.

39. The method of claim 38 wherein said trench region is disposed beneath a portion of at least one of said connector region and said adjacent pair of lines.

40. The method of claim 38 wherein said trench is disposed beneath at least a portion of said connector region and a portion of at least one of said lines.

41. The method of claim 38 wherein said trench is disposed beneath at two of said lines.

42. The method of claim 36 wherein said lithographic mask pattern comprises a deep trench pattern of a memory device.

43. A lithographic mask comprising:
a mask pattern that includes at least one adjacent pair of spaces and a first substantially opaque feature disposed between said adjacent pair of spaces, wherein one space of each adjacent pair of spaces of said lines and spaces pattern transmits light with an opposite phase shift to that of another space of said adjacent pair of spaces, and
at least one connector region incorporated in said mask pattern between ends of said first substantially opaque feature and a second substantially opaque feature such that said adjacent pair of spaces do not intersect one another,
a portion of said mask pattern being coincident with a previously defined trench region such that said trench region prevents a printed pattern of said first substantially opaque feature and said second substantially opaque feature from shorting to one another.

44. The lithographic mask of claim 43 wherein at least a portion of said connector region coincident with said trench region.

45. The lithographic mask of claim 43 wherein said mask pattern includes an array region comprised of at least one lines and spaces pattern, one space of each adjacent pair of spaces of said lines and spaces pattern transmitting light with an opposite phase shift to that of another space of said adjacent pair of spaces, and said connector region is incorporated in said lines and spaces pattern between ends of at least one adjacent pair of lines.

46. The lithographic mask of claim 45 wherein a portion of at least one of said connector region and said adjacent pair of lines is coincident with a previously defined trench region.

47. The lithographic mask of claim 45 wherein said connector region connects all of said lines at an end of said lines and spaces pattern.

48. The lithographic mask of claim 45 wherein said connector region comprises a plurality of connectors each connecting a respective pair of lines of said lines and spaces pattern at said end of said pair of lines.

49. The lithographic mask of claim 45 wherein at least a portion of said connector region and a portion of at least one of said lines are disposed atop said trench region.

50. The lithographic mask of claim 45 wherein at least two of said lines are disposed atop said trench region.

51. The lithographic mask of claim 43 wherein said photolithographic mask pattern comprises an active area mask pattern of a memory device.

* * * * *

UNITED STATES PATENT AND TRADEMARK OFFICE
CERTIFICATE OF CORRECTION

PATENT NO. : 7,413,833 B2
APPLICATION NO. : 10/846275
DATED : August 19, 2008
INVENTOR(S) : Butt et al.

It is certified that error appears in the above-identified patent and that said Letters Patent is hereby corrected as shown below:

In Col. 2, line 44, delete "phase-sift" and insert --phase-shift--.
In Col. 2, line 54, delete "lease" and insert --least--.
In Col. 3, line 38, delete "patterned" and insert --pattern--.
In Col. 6, line 57, delete "to" and insert --so--.
In Col. 12, line 37 claim 17, delete "Wench" and insert --trench--.
In Col. 14, line 16 claim 36, delete "though" and insert --through--.
In Col. 14, line 36 claim 41, after "at" insert --least--.
In Col. 14, line 58 claim 44, after "region" insert --is--.

Signed and Sealed this

Twenty-first Day of October, 2008

JON W. DUDAS
*Director of the United States Patent and Trademark Office*